US009869782B2

(12) United States Patent
Lacy (10) Patent No.: US 9,869,782 B2
(45) Date of Patent: Jan. 16, 2018

(54) METHOD AND APPARATUS FOR COATING THIN FOIL WITH A BORON COATING

(71) Applicant: Proportional Technologies, Inc., Houston, TX (US)

(72) Inventor: Jeffrey L Lacy, Houston, TX (US)

(73) Assignee: Proportional Technologies, Inc., Houston, TX (US)

( * ) Notice: Subject to any disclaimer, the term of this patent is extended or adjusted under 35 U.S.C. 154(b) by 823 days.

(21) Appl. No.: 14/060,015

(22) Filed: Oct. 22, 2013

(65) Prior Publication Data

US 2014/0110247 A1 Apr. 24, 2014

Related U.S. Application Data

(60) Provisional application No. 61/717,000, filed on Oct. 22, 2012.

(51) Int. Cl.
*C23C 14/56* (2006.01)
*C23C 14/16* (2006.01)
(Continued)

(52) U.S. Cl.
CPC .............. *G01T 3/008* (2013.01); *B21C 37/09* (2013.01); *C23C 14/021* (2013.01);
(Continued)

(58) Field of Classification Search
CPC ... B21C 37/0818; B21C 37/09; B23K 31/027; B65H 18/103; C23C 14/021;
(Continued)

(56) References Cited

U.S. PATENT DOCUMENTS 2,289,390 A * 7/1942 Torrence ................ B65H 51/22
242/366.2
3,884,787 A * 5/1975 Kuehnle ............. C23C 14/3464
118/718
(Continued)

FOREIGN PATENT DOCUMENTS

WO WO 8904246 A * 5/1989

*Primary Examiner* — Michael Band
(74) *Attorney, Agent, or Firm* — Hasley Scarano, L.L.P.

(57) ABSTRACT

An apparatus and a process is disclosed for applying a boron coating to a thin foil. Preferably, the process is a continuous, in-line process for applying a coating to a thin foil comprising wrapping the foil around a rotating and translating mandrel, cleaning the foil with glow discharge in an etching chamber as the mandrel with the foil moves through the chamber, sputtering the foil with boron carbide in a sputtering chamber as the mandrel moves through the sputtering chamber, and unwinding the foil off the mandrel after it has been coated. The apparatus for applying a coating to a thin foil comprises an elongated mandrel. Foil preferably passes from a reel to the mandrel by passing through a seal near the initial portion of an etching chamber. The mandrel has a translation drive system for moving the mandrel forward and a rotational drive system for rotating mandrel as it moves forward. The etching chamber utilizes glow discharge on a surface of the foil as the mandrel moves through said etching chamber. A sputtering chamber, downstream of the etching chamber, applies a thin layer comprising boron onto the surface of the foil as said mandrel moves through said sputtering chamber. Preferably, the coated foil passes from the mandrel to a second reel by passing through a seal near the terminal portion of the sputtering chamber.

33 Claims, 12 Drawing Sheets (51) Int. Cl.
  *C23C 14/06* (2006.01)
  *C23C 14/02* (2006.01)
  *B21C 37/09* (2006.01)
  *B65H 18/10* (2006.01)
  *G01T 3/00* (2006.01)
  *B21C 37/08* (2006.01)

(52) U.S. Cl.
  CPC ........ C23C 14/025 (2013.01); C23C 14/0635 (2013.01); C23C 14/165 (2013.01); C23C 14/562 (2013.01); *B21C 37/0818* (2013.01); *B65H 18/103* (2013.01); *B65H 2301/51145* (2013.01)

(58) Field of Classification Search
  CPC . C23C 14/025; C23C 14/0635; C23C 14/165; C23C 14/562; G01T 3/008
  See application file for complete search history.

(56) References Cited

U.S. PATENT DOCUMENTS

| | | | | |
|---|---|---|---|---|
| 4,074,539 A | * | 2/1978 | Guild | E02D 7/30 405/246 |
| 5,057,199 A | * | 10/1991 | Lievens | C23C 14/562 204/192.15 |
| 2008/0029386 A1 | * | 2/2008 | Dorfman | C23C 14/022 204/192.12 |

* cited by examiner

METHOD AND APPARATUS FOR COATING THIN FOIL WITH A BORON COATING

RELATED APPLICATIONS

This application claims priority to U.S. Provisional Application No. 61/717,000 ("the '000 application") filed Oct. 22, 2012. The '000 application is hereby incorporated by reference in its entirety for all purposes, including but not limited to, all portions describing the coating process of the present invention, those portions describing boron-coated straw detectors in general as background and for use as specific embodiments of the present invention, and those portions describing other aspects of manufacturing and testing of boron-coated straws that may relate to the present invention.

GOVERNMENTAL SPONSORSHIP

This invention was made with government support under DE-SC009615 awarded by the Department of Energy. The government may have certain rights in the invention.

REFERENCE TO A SEQUENTIAL LISTING

Not applicable.

BACKGROUND OF THE INVENTION

Field of the Invention

This invention relates to applying coatings to thin foils. More particularly, this invention relates to applying boron carbide coatings to thin metallic foils. Even more particularly, this invention relates to a continuous process for applying a boron coating to metallic foils which are utilized to manufacture boron-coated straw neutron detectors.

Description of the Related Art

The application of neutron detection technology to the fields of national security, oil/gas exploration, nuclear safeguards, neutron science instrumentation and other areas is greatly expanding. Unfortunately, the neutron detection systems of choice which utilizes pressurized tubes of $^3$He have several limitations. While these systems can provide the needed spatial resolution and gamma ray discrimination, this technology cannot achieve high rate operation because of slow drift of positive ions. Furthermore, large detection areas are costly, because of the complexity of the pressure vessels required, and parallax errors limit the time-of-flight accuracy of the instrument. Perhaps the most problematic issue for the future of $^3$He detectors is a severe shortage of $^3$He. Existing stockpiles of 3 He will soon be depleted and only limited amounts are naturally available or available from decay of U.S. and Russian tritium supplies. Future instrument expansions will likely not afford the escalating cost of the dwindling 3He supply.

Recognizing the problems with $^3$He detector systems early on, Dr. Jeffery L. Lacy developed a new technology for replacing the $^3$He detectors. The technology was the boron-coated straw detector. The boron-coated straw (BCS) detector was based on arrays of thin walled boron-coated copper tubes. The elemental component of this detector was a long tube ("straw"), generally about 1 to 4 mm in diameter, coated on the inside with a thin layer of $^{10}$B-enriched boron carbide ($^{10}$B$_4$C).

Thermal neutrons captured in $^{10}$B are converted into secondary particles, through the $^{10}$B(n,α) reaction:

$$^{10}B + n \rightarrow {}^7Li + \alpha \quad (1)$$

The $^7$Li and α particles are emitted isotropically in opposite directions with kinetic energies of 1.47 MeV and 0.84 MeV, respectively (dictated by the conservation of energy and momentum). For a boron carbide layer that is only about 1 µm thick, one of the two charged particles will escape the wall 78% of the time, and ionize the gas contained within the straw.

Each BCS detector was operated as a proportional counter, with its wall acting as the cathode, and a thin wire tensioned through its center serving as the anode electrode, operated at a high positive potential. Primary electrons liberated in the gas drift to the anode, and in the high electric field close to the anode, avalanche multiplication occurs, delivering a very much amplified charge on the anode wire. Standard charge-sensitive preamplifier and shaping circuitry were used to produce a low noise pulse for each neutron event. Gamma interactions in the wall produced near minimum ionizing electrons that deposit a small fraction of the energy of the heavily ionizing alpha and Li products. Gamma signals were effectively discriminated with a simple pulse height threshold.

The boron-coated straw detector technology was first patented by Dr. Lacy in U.S. Pat. No. 7,002,159 entitled "Boron-Coated Straw Neutron Detector" based upon a Nov. 13, 2002, filing. As the thought leader of this technology area, Dr. Lacy continued his research and development to improve the boron coated straw detectors and to find new uses. Examples of Dr. Lacy's continued progress in this technology area are found in his other issued patents and pending patent applications which include: U.S. Pat. No. 8,330,116 entitled "Long Range Neutron-Gamma Point Source Detection and Imaging Using Rotating Detector"; U.S. patent application Ser. No. 12/792,521 filed Jun. 2, 2010, entitled "Optimized Detection of Fission Neutrons Using Boron-Coated Straw Detectors Distributed in Moderator Material" (allowed and issue fee paid); U.S. patent application Ser. No. 13/106,785 filed May 12, 2011, entitled "Sealed Boron-Coated Straw Detectors", U.S. patent application Ser. No. 13/106,818 filed May 12, 2011, entitled "Neutron Detectors for Active Interrogation"; and U.S. patent application Ser. No. 13/683,404 filed Nov. 21, 2012, entitled "Boron Coated Straw Detectors with Shaped Straws." These patent and pending applications mentioned in this paragraph are hereby incorporated by reference in their entirety for all purposes, including but not limited to those portions describing the structure and technical details of the boron-coated straw detectors as background and for use as specific embodiments of the present invention, and those portions describing other aspects of manufacturing and testing of boron-coated straws that may relate to the present invention.

Dr. Lacy also widely published articles on boron-coated straw detection capabilities, fabrication, and development of prototypes for various applications including:

J. L. Lacy, et al, "Novel neutron detector for high rate imaging applications", *IEEE Nuclear Science Symposium Conference Record*, 2002, vol. 1, pp. 392-396;

J. L. Lacy, et al, "Straw detector for high rate, high resolution neutron imaging", in *IEEE Nuclear Science Symposium Conference Record*, 2005, vol. 2, pp. 623-627;

J. L. Lacy, et al, "High sensitivity portable neutron detector for fissile materials detection", *IEEE Nuclear Science Symposium Conference Record*, 2005, vol. 2, pp. 1009-1013;

J. L. Lacy, et al, "Performance of 1 Meter Straw Detector for High Rate Neutron Imaging", *IEEE Nuclear Science Symposium Conference Record*, 2006, vol. 1, pp. 20-26;

J. L. Lacy, et al, "Long range neutron-gamma point source detection and imaging using unique rotating detector", *IEEE Nuclear Science Symposium Conference Record*, 2007, vol. 1, pp. 185-191;

J. L. Lacy, et al, "Fabrication and materials for a long range neutron-gamma monitor using straw detectors", *IEEE Nuclear Science Symposium Conference Record*, 2008, pp. 686-691;

J. L. Lacy, et al, "One meter square high rate neutron imaging panel based on boron straws", *IEEE Nuclear Science Symposium Conference Record*, 2009, pp. 1117-1121;

J. L. Lacy, et al, "Boron coated straw detectors as a replacement for $^3$He", *IEEE Nuclear Science Symposium Conference Record*, 2009, pp. 119-125;

J. L. Lacy, et al, "One meter square high rate neutron imaging panel based on boron straws", *IEEE 2009 Nuclear Science Symposium Conference Record*, 2009, pp. 1117-1121;

J. L. Lacy, et al, "Initial performance of large area neutron imager based on boron coated straws", *IEEE 2010 Nuclear Science Symposium Conference Record*, 2010, pp. 1786-1799;

J. L. Lacy, et al, "Initial performance of sealed straw modules for large area neutron science detectors", *IEEE 2011Nuclear Science Symposium Conference Record*, 2011, pp. 431-435;

J. L. Lacy, et al, "Straw-Based Portal Monitor $^3$He Replacement Detector with Expanded Capability", *IEEE 2011 Nuclear Science Symposium Conference Record*, 2011, pp. 431-435;

J. L. Lacy, et al, "Performance of a Straw-Based Portable Neutron Coincidence/Multiplicity Counter", *IEEE 2011 Nuclear Science Symposium Conference Record*, 2011, pp. 529-532;

J. L. Lacy, et al, "Replacement of $^3$He in Constrained-Volume Homeland Security Detectors", *IEEE 2011 Nuclear Science Symposium Conference Record*, 2011, pp. 324-325;

J. L. Lacy, et al, "Initial performance of sealed straw modules for large area neutron science detectors", *IEEE 2011 Nuclear Science Symposium Conference Record*, 2011, pp. 431-435;

J. L. Lacy, et al, "Boron-coated straws as a replacement for 3He-based neutron detectors", *Nuclear Instruments and Methods in Physics Research*, Vol. 652, 2011, pp. 359-363;

J. L. Lacy, et al, "Design and Performance of High-Efficiency Counters Based on Boron-Lined Straw Detectors", *Institute of Nuclear Materials Management Annual Proceedings*, 2012;

J. L. Lacy, et al, "Boron-coated straw detectors of backpack monitors", *IEEE Transactions on Nuclear Science*, Vol. 60, No. 2, 2013, pp. 1111-1117.

J. L. Lacy, et al, "The Evolution of Neutron Straw Detector Applications in Homeland Security", *IEEE Transactions on Nuclear Science*, Vol. 60, No. 2, 2013, pp. 1140-1146.

Each of these publications is hereby incorporated by reference into this application in their entirety for all purposes.

The key sensing element in boron-coated neutron detectors has been the very thin (nominally about 1 µm) coating of $^{10}$B. There have been two approaches used in the prior art for laying down such coatings. One technique utilized by many manufacturers has been a chemical adhesion technique. A suspension of small $^{10}$B particles was introduced into the detector tube and allowed to evaporate at high temperature until a liquid binder solidified and bound the $^{10}$B particles to the detector wall. This method had many drawbacks including (1) residual binder was always present at high enough level to reduce the escape efficiency of the charged particles and hence lower efficiency; (2) the binder, depending on its composition, could introduce outgassing components into the counting gas and result in aging of the detector; (3) it was extraordinarily difficult to produce a uniform coating that was accurate to tenths of a micron causing variability in detector response along the longitudinal axis of the detector; (4) it was extraordinarily difficult examine the coating inside the tube after being deposited because the only entry into the tube was a narrow gas file port; and (5) many detectors utilizing this method demonstrated detachment of the thin film as the detector was exposed to thermal cycling and physical shock and vibration. The chemical binding employed by the method suffers from inconsistencies in procedure and from the basic weakness of the chemical glue like bond.

In a second method that was develop by Dr. Lacy, a sputtering technique was used to deposit enriched boron carbide on the thin substrate. As discussed in U.S. Pat. No. 7,002,159, the initial boron-coated straw detectors were made using ribbons of $^{10}$B coated material and helically winding those coated ribbons with a second ribbon having no coating as an outer overlapping layer (i.e., one over the other) with application of a very thin fast setting adhesive layer onto a precision cylindrical mandrel, producing a bonded and rigid, cylindrical detector straw.

The $^{10}$B ribbons were formed through vapor deposition of boron carbide ($B_4C$), vapor deposited on aluminum or Mylar foils using a plasma deposition process. In the described embodiment, deposition was accomplished by wrapping narrow 9.5 mm wide and 25 µm thick strips or ribbons of the respective materials around a cylindrical drum (16" diameter×16" long), which thereafter was rotated adjacent to a sputtering head. A tape running down the side of the drum kept the strips in place (but also produced a 1 cm dead space every 50"). Using this process, a uniform boron carbide coating was achieved on continuous strips of material with a length up to 50 meters. Prior to straw construction the coating quality could be easily evaluated by very simple tests such as application of mechanical and thermal stress to assure 100% bonding reliability.

In practice, the method of producing the '159 patent coated ribbon was limited. This batch process required substantial time in preparation and pump down which limited the production capacity. Further, because the size of the production run was limited to the material fitting on the drum, therefore each production run produced a small quantity (approximately 0.8 m$^2$ per day at a cost of over $3700 per/m$^2$.

As can be seen, as the need for neutron detection systems expands, and boron-coated straw detector systems replace $^3$He detectors in many applications, there will be an increasing need for a method of manufacturing greater number of boron-coated straws for these detectors. Since the prior art process of manufacturing straws was limited by the amount of foil that can be coated, there exists a specific need for a better process that can produce the quality of boron-coating on the foil in increasing quantity.

SUMMARY OF THE INVENTION

The present invention is an apparatus and a process for applying a boron coating to a thin foil. Preferably, the process is a continuous, in-line process for applying a coating to a thin foil comprising wrapping the foil around a rotating and translating mandrel, cleaning the foil with glow discharge in an etching chamber as the mandrel with the foil moves through the chamber, sputtering the foil with boron carbide in a sputtering chamber as the mandrel moves through the sputtering chamber, and unwinding the foil off the mandrel after it has been coated.

The preferred apparatus for applying a coating to a thin foil comprising an elongated, cylindrical mandrel. The mandrel is preferably made from aluminum pipe, approximately 4" nominal O.D. and about 24 feet in length. A foil input reel containing a roll of thin foil is operably connected to the mandrel to wrap the thin copper foil from the roll onto the mandrel. Preferably, the foil passes from the reel to the mandrel by passing through a seal near the initial portion of an etching chamber. The mandrel has a translation drive system for moving the mandrel forward and a rotational drive system for rotating mandrel as it moves forward. In a most preferred embodiment, the speed of rotation is controlled as a function of the translation speed. The apparatus further includes an etching chamber for glow discharge cleaning and conditioning a surface of the foil as said mandrel moves through said etching chamber. The apparatus has a sputtering chamber, downstream of the etching chamber, for sputtering a thin layer comprising boron onto the surface of the foil as said mandrel moves through said sputtering chamber. After the foil is coated, a coated foil uptake reel removes the foil from the mandrel. Preferably, the coated foil passes from the mandrel to the reel by passing through a seal near the terminal portion of the sputtering chamber.

BRIEF DESCRIPTION OF SEVERAL VIEWS OF THE DRAWINGS

A better understanding of the invention can be obtained when the detailed description set forth below is reviewed in conjunction with the accompanying drawings, in which:

FIG. 3 A-C depict an embodiment of a male mandrel coupling, a female mandrel coupling, and the male coupling of a first mandrel being connected to the female coupling of a second mandrel, respectively;

FIG. 10 A/B is a depiction of an embodiment of the inside, and the outside, respectively, of a partially constructed sputtering chamber for use in the apparatus.

DETAILED DESCRIPTION OF VARIOUS EMBODIMENTS OF THE INVENTION

In a preferred embodiment of the present invention, a continuous reel to reel process is utilized for application of a boron coating onto the surface of a foil. The continuous process preferably comprises drawing the foil from a reel housed inside the vacuum system onto a rotating and translating mandrel, cleaning the foil with glow discharge in an etching chamber as the mandrel with the foil wrapped around it moves through the chamber, preferably applying a thin metallic adhesion coating of preferably Chrome by physical vapor deposition (PVD), then applying a boron coating, preferably boron carbide, by PVD as the mandrel moves through the PVD chamber, and finally unwinding the foil off the mandrel onto another reel also inside the vacuum system after it has been coated. A preferred embodiment of the process of the present invention can run continuously, twenty-four hours a day, for long periods of time limited only by exhaustion of PVD targets or input foil.

Figure 1:
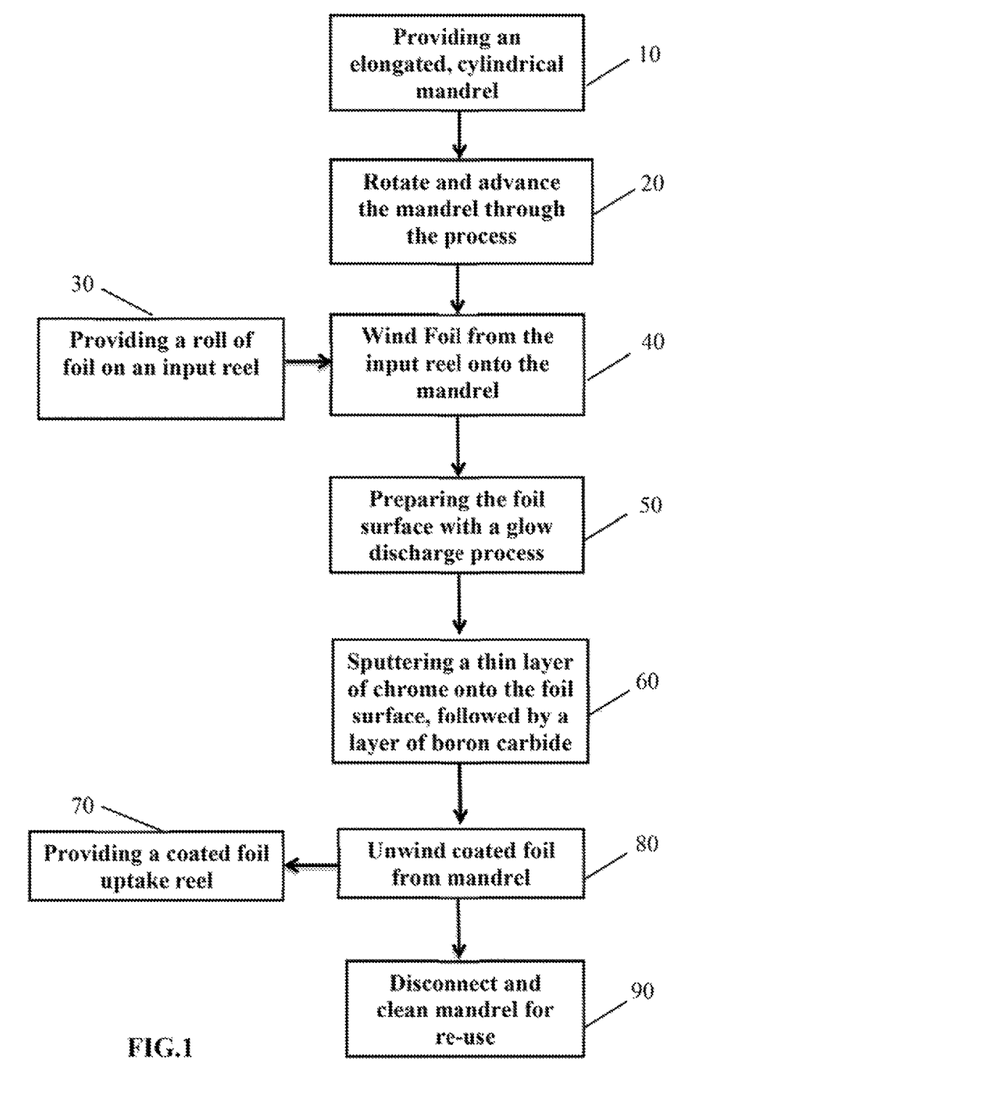
FIG. 1 is a process flow diagram of an embodiment of the process for coating thin foil with a boron carbide coating.
Figure 3A:
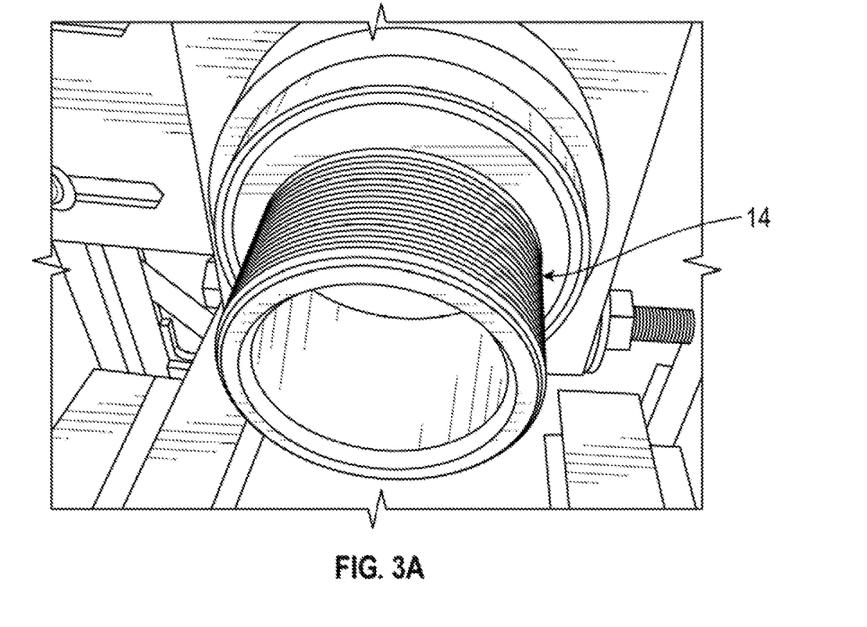
Figure 3B:
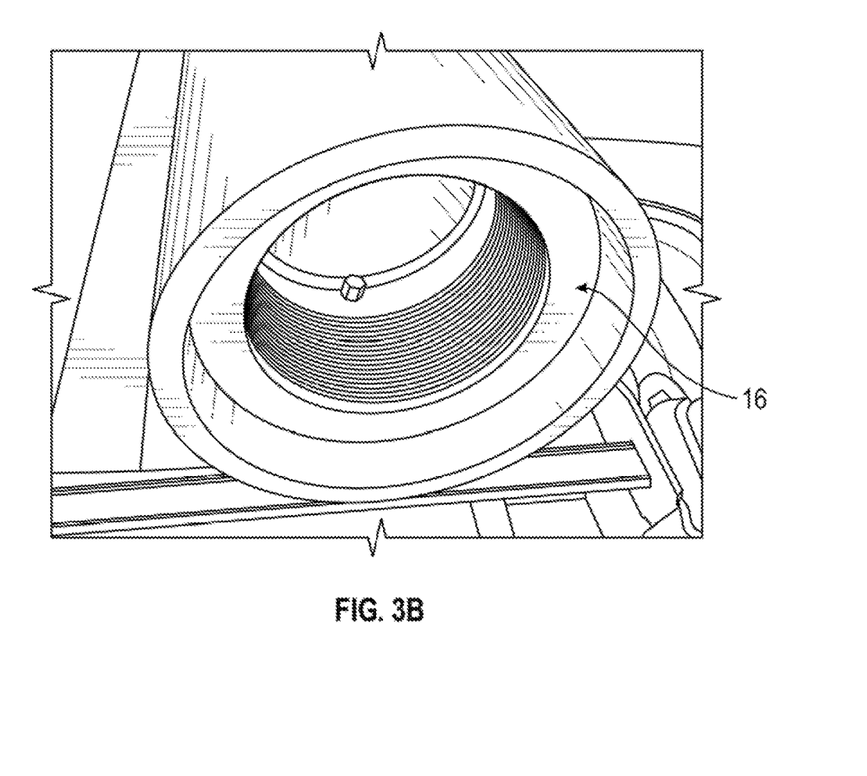
Figure 3C:
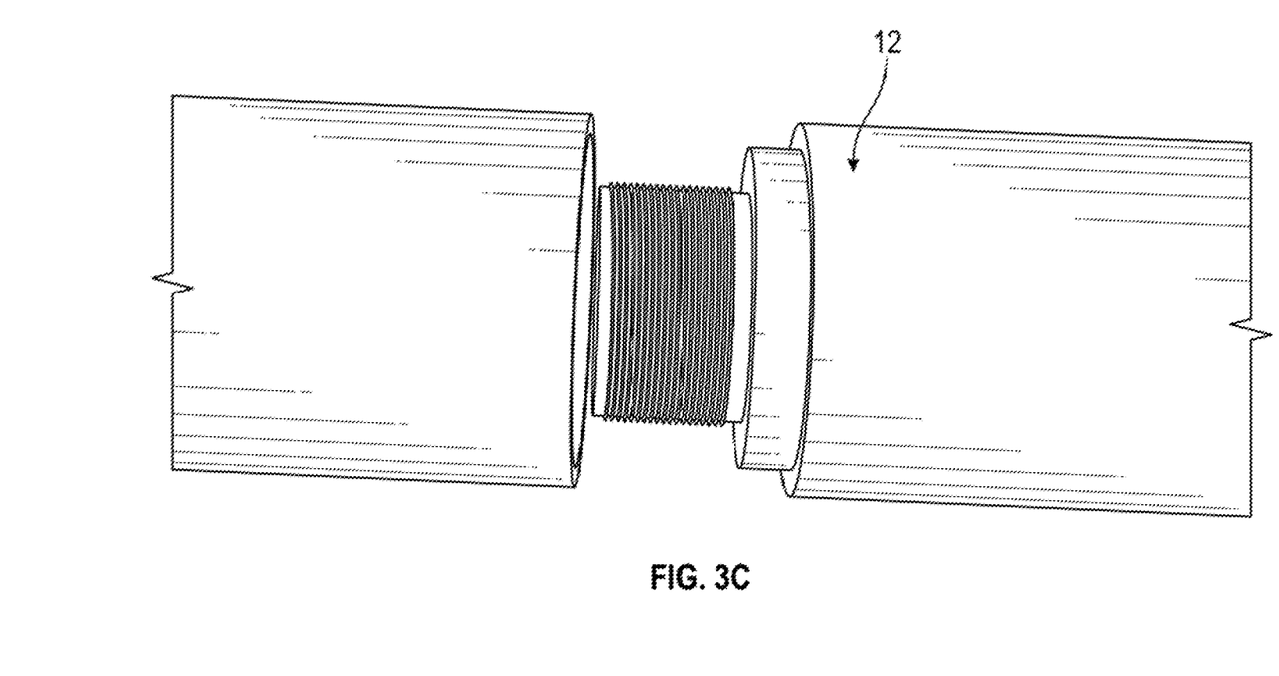
Figure 4:
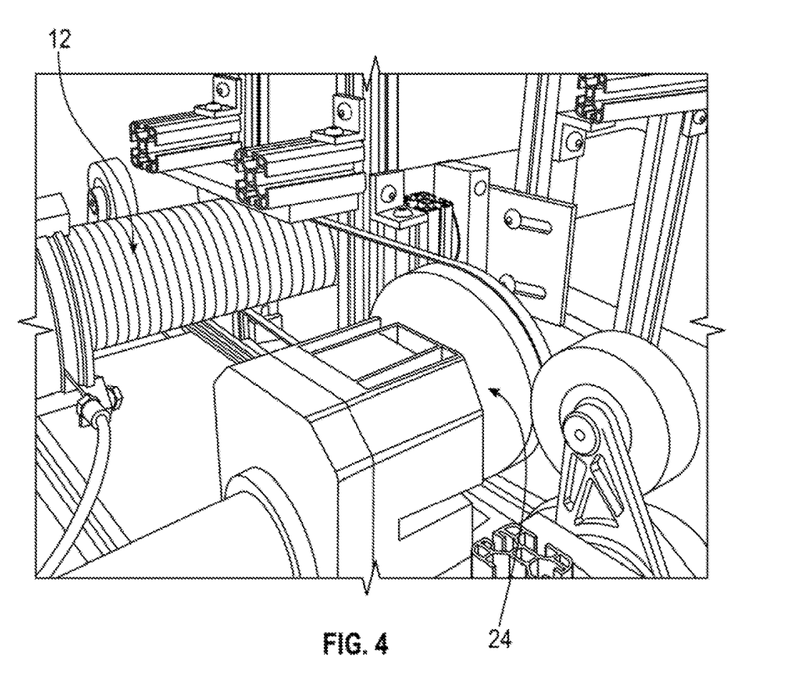
FIG. 4 is a depiction of an embodiment of a rotational drive system such as may be used with the apparatus.

As shown in FIG. 1, the process begins with the step 10 of providing a mandrel 12. The mandrel 12 is preferably prepared from a long section of aluminum or similar pipe having a diameter of between about 3 to 8 inches. In a preferred embodiment, the mandrel is approximately 24 feet in length. A coupling is attached to each end of the mandrel 12, preferably (See FIGS. 3A-C) a male screw connection 14 on one end and a female screw connection 16 on the opposite end. The couplings allow a second mandrel 12 to be connected to the first mandrel 12. Preferably, an O-ring is provided with connection 14 to provide a vacuum seal between the mandrels. As the first mandrel 12 passes out of the process, it can be disconnected, cleaned and reconnected to the opposite end of the second mandrel 12. This allows the process to proceed continuously.

A drive train 24 rotates and translates the mandrel pair continuously through the process. This is preferably accomplished by driving a steel belt wrapped around the mandrel under tension and positioned at an appropriate non-orthogonal orientation providing both linear translation and rotation. In one embodiment of the invention, the drive train 22 comprises separate rotational and translational drive systems. Alternatively, the rotational drive system can be an electric motor in rotational engagement with the mandrel 12. The translation drive system 26 is preferably an automated winch system that can removably connect to the mandrel to advance the mandrel through the process.

Figure 6:
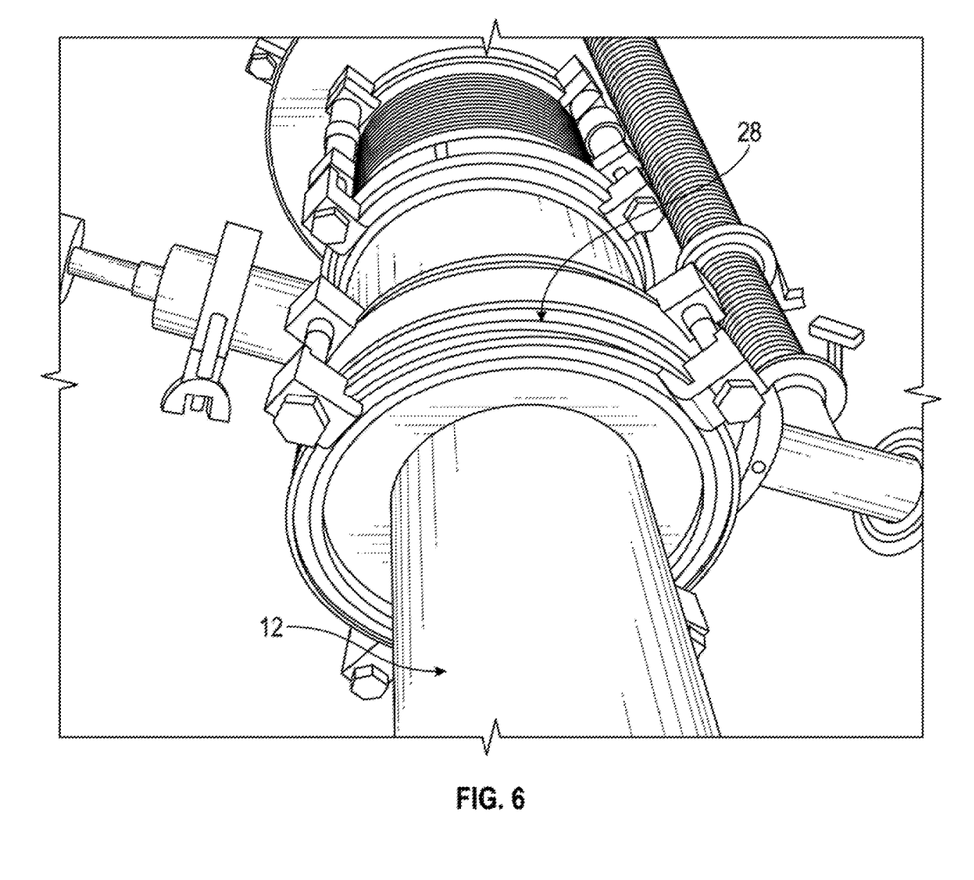
FIG. 6 is a depiction of an embodiment of a transition chamber for use with the apparatus.

A transitioning chamber 28 (See FIG. 6) is utilized to transition the mandrel as it advances from atmosphere pressure to high level of vacuum that exists in the chamber 52. The transition is preferably achieved through energized seals which preferably utilize steel springs and Teflon® or using Teflon coated soft O-ring seals. Multiple seals may be utilized to provide the sealing quality required for the transition chamber and the overall vacuum tightness of the system. In one embodiment, a second transition chamber is included sealed with similar seals and an inert gas, such as argon, is streamed through this chamber while maintaining positive pressure relative to atmosphere to prevent air and humidity contamination.

Figure 5:
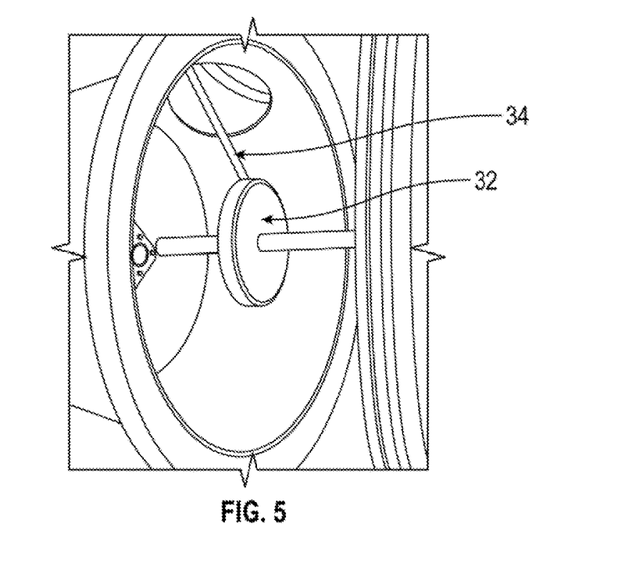
FIG. 5 is a depiction of an embodiment of an input reel for use with the apparatus.
Figure 7:
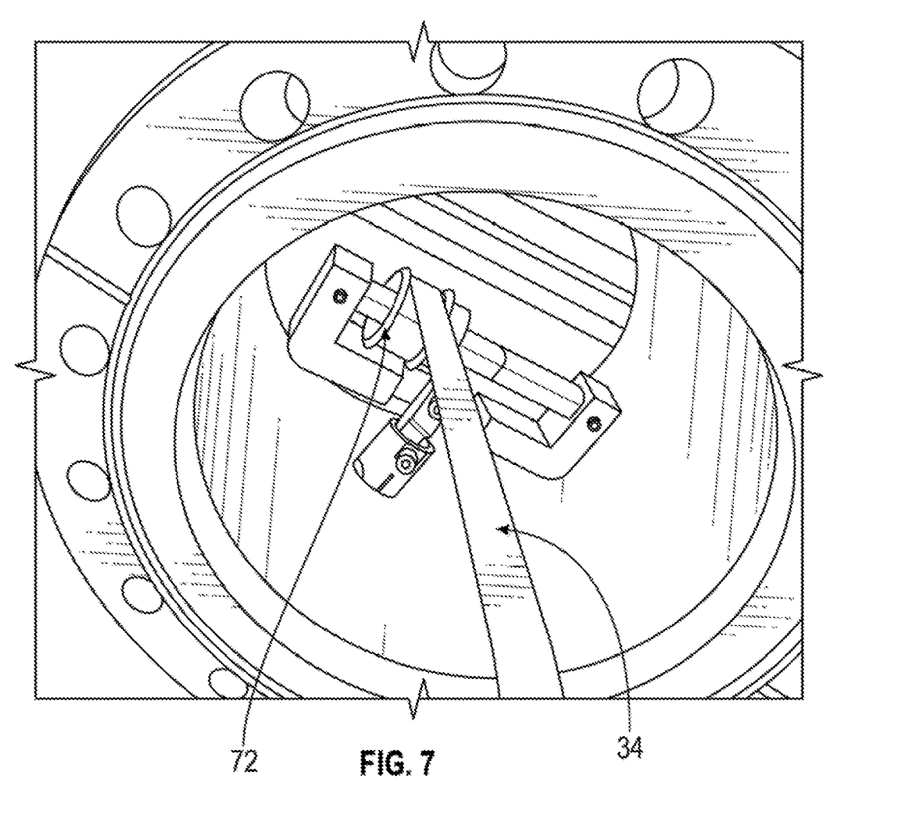
FIG. 7 is a depiction of an embodiment of that portion of the apparatus wherein foil is fed into the chamber for wrapping around the mandrel.

The next step 30 of the process involves providing an input reel 32 containing a roll of foil 34. The foil 34 may be a thin metal, such as copper or aluminum, or a plastic material. Preferably, the foil 34 has a width of between about 0.25 and about three inches. The foil input reel 32 (See FIG. 5) is preferably housed in a large chamber connected through a large pass through port to the etching chamber. This input reel chamber preferably operates at the same pressure as the etching chamber. As mandrel 12 rotates, foil is pulled over a set of roller guides from the input reel 32 and winds on the mandrel 12 (See FIG. 7). The tension of the foil 34 entering the etching chamber 52 is preferably set by application of controlled torque to the reel. Preferably, torque is passed from a torque motor outside the vacuum into the vacuum through a ferrofluidic rotary seal.

Figure 8:
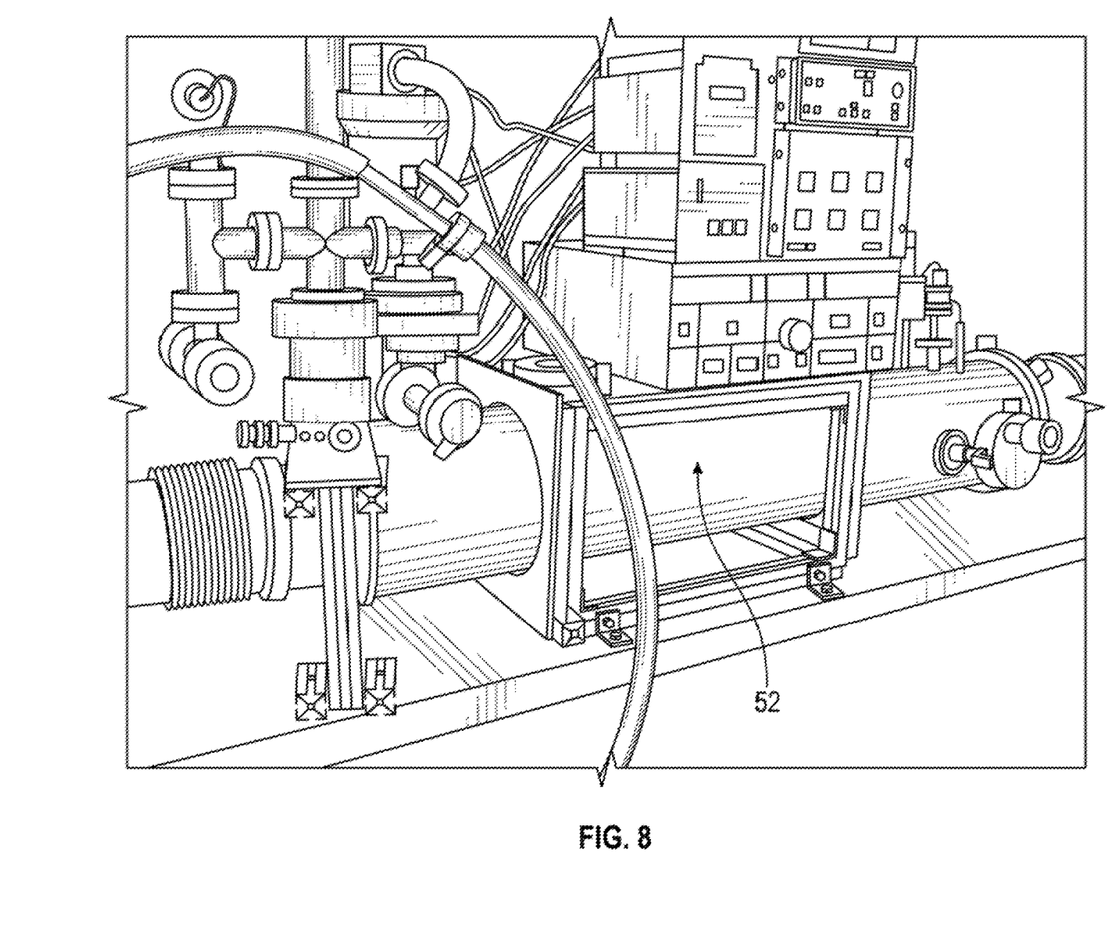
FIG. 8 is a depiction of an embodiment of an etching chamber for use with the apparatus.

As the wrapped foil 34 advances, it enters the surface conditioning or etching step 50. The etching chamber 52 (or conditioning chamber) is used to clean the surface of the foil 34, preferably with glow discharge bombardment of Argon ions, before sputtering. (See FIG. 8). This cleaning step is important in achieving high quality coating adhesion quality of the sputtered materials occurring in the following chamber.

Figure 2:
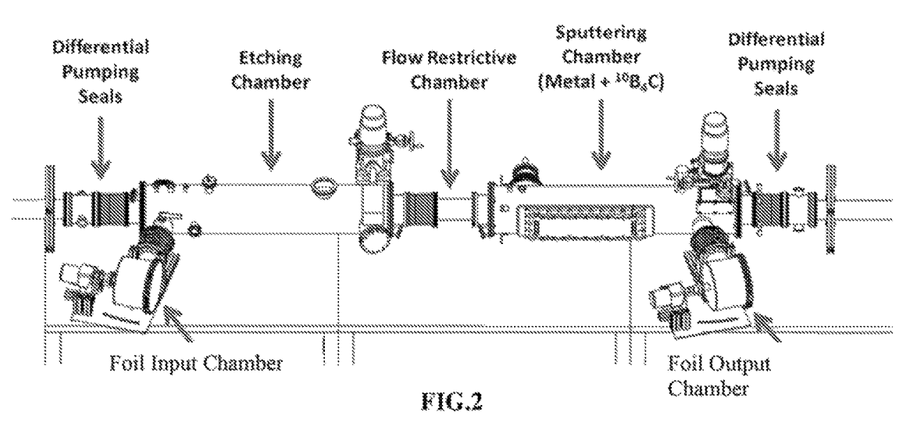
FIG. 2 is a depiction of an embodiment of the apparatus for coating thin foil with a boron carbide coating.

In a preferred embodiment of the invention, a flow restrictive chamber (See FIG. 2) is utilized in between etching chamber 52 and sputtering chamber 62. Flow restrictive chamber 58 introduces a thin, lengthy annular gap allowing the etching chamber 52 and sputtering chamber 62 to operate at different pressures.

Once the foil 34 has been conditioned properly in the etching step 50, the foil 34 enters the sputtering step 60. The second process chamber 62 is a magnetron sputter system (See FIG. 9). In this chamber 62, a thin adhesion layer, preferably chrome, is sputtered onto the foil. Following the application of the adhesion layer, a boron coating, preferably a boron carbide coating, is sputtered onto the adhesion layer. In a preferred embodiment, a Baratron system regulates the pressure in the sputter chamber by leaking high purity Argon gas into the system. At the same time, a high capacity turbo molecular vacuum pump pumps the chamber. By this manner, a very high purity Argon environment is achieved at the precise optimal pressure to support magnetron sputtering. In this process Argon is ionized and driven into the boron carbide target with sufficient energy to release $B_4C$ molecules from the surface of the cathode. Preferably, a cathode surface area of about 3.5"×19.5" area is provided and a plasma power level of about 5000-7000 Watts supplying sufficient sputtering rate to achieve a product output rate of >3.7 $m^2$ per 24 hour operation time. Levels of contaminant gas molecules such as O2, N2, and H2O are preferably maintained below about 1% of the Argon gas pressure in order to achieve low contaminations levels of less than 1% in the boron carbide coating when used in boron straw neutron detectors.

Figure 10A:
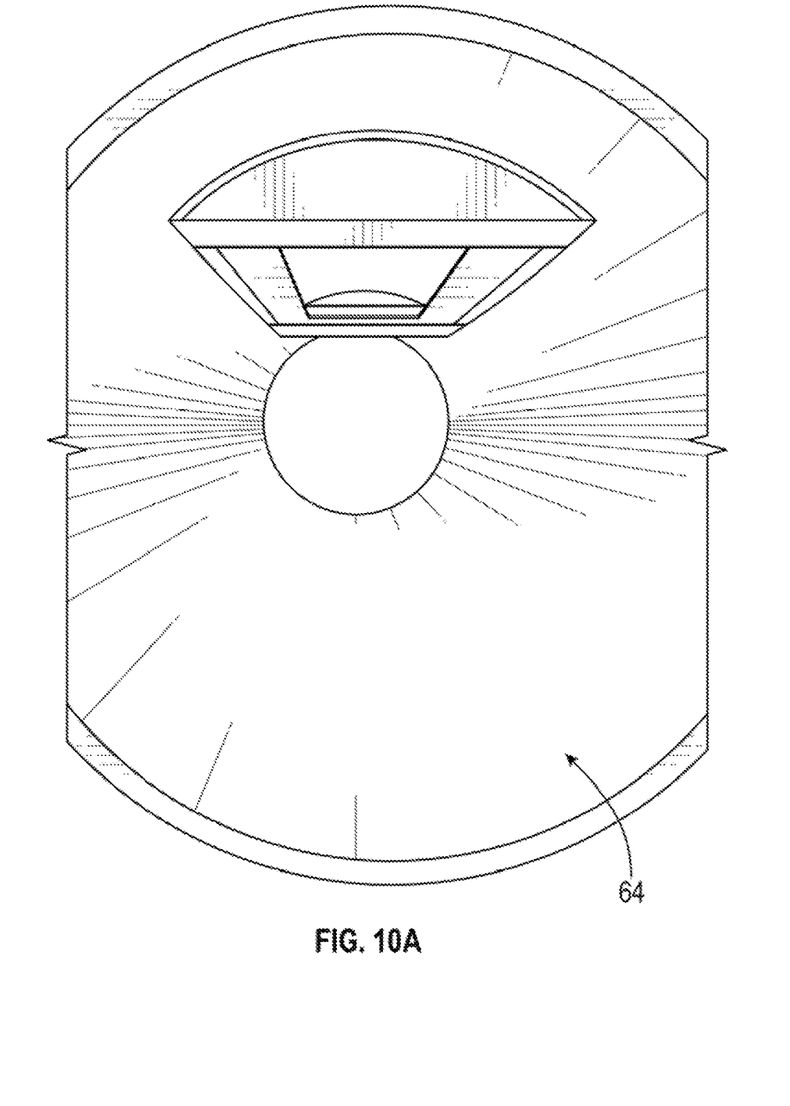
Figure 10B:
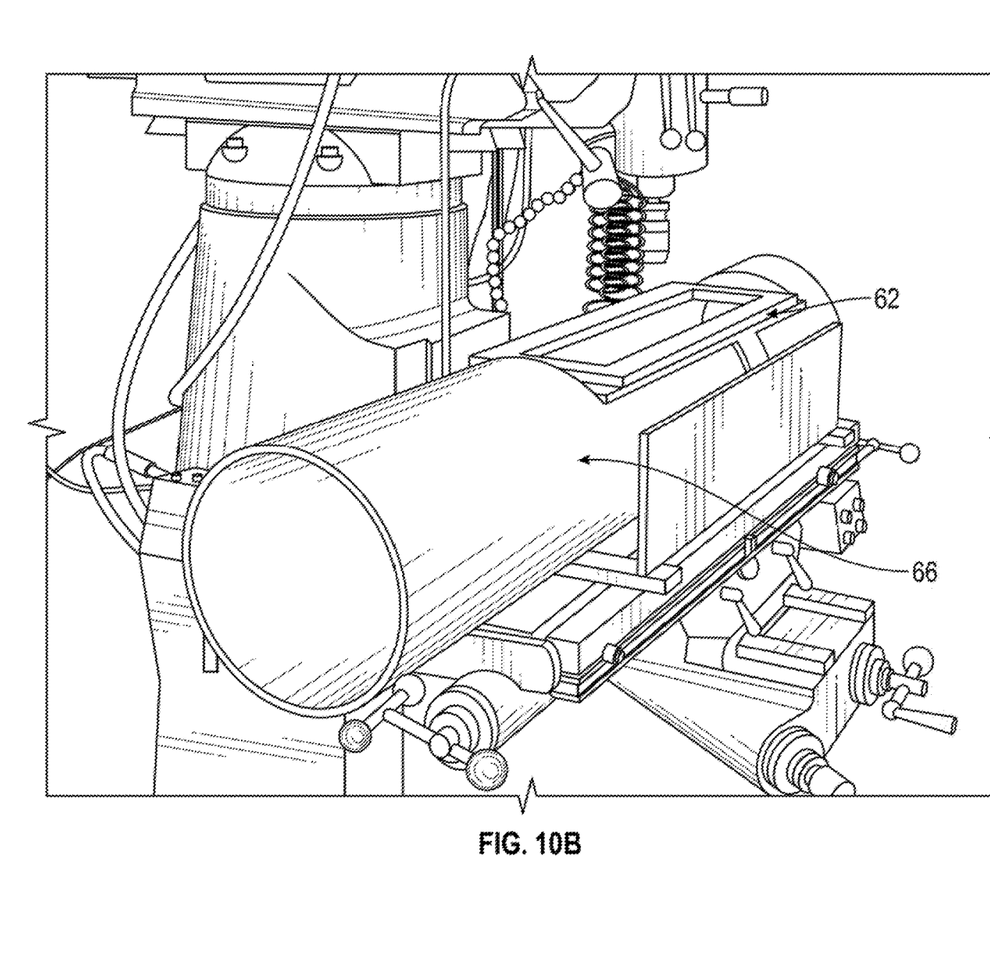

As shown in FIGS. 10A and 10B, the sputtering chamber 62 preferably has a cylindrical shaped interior 64 with one or more rectangular openings 66 in the horizontal side portion thereof.

One advantage of the laying out the process as this series of long cylindrical chambers (See FIG. 2) is that the process can be easily disassembled for cleaning and maintenance. Also, the volume of the vacuum chamber that must be pumped and outgassed is considerably reduced, preferably to less than 10 $ft^3$ which is classed as a small chamber by industrial standards. Cleaning and maintenance of the system can be accomplished in less than 6 hours of down time per week of continuous operation.

Figure 9:
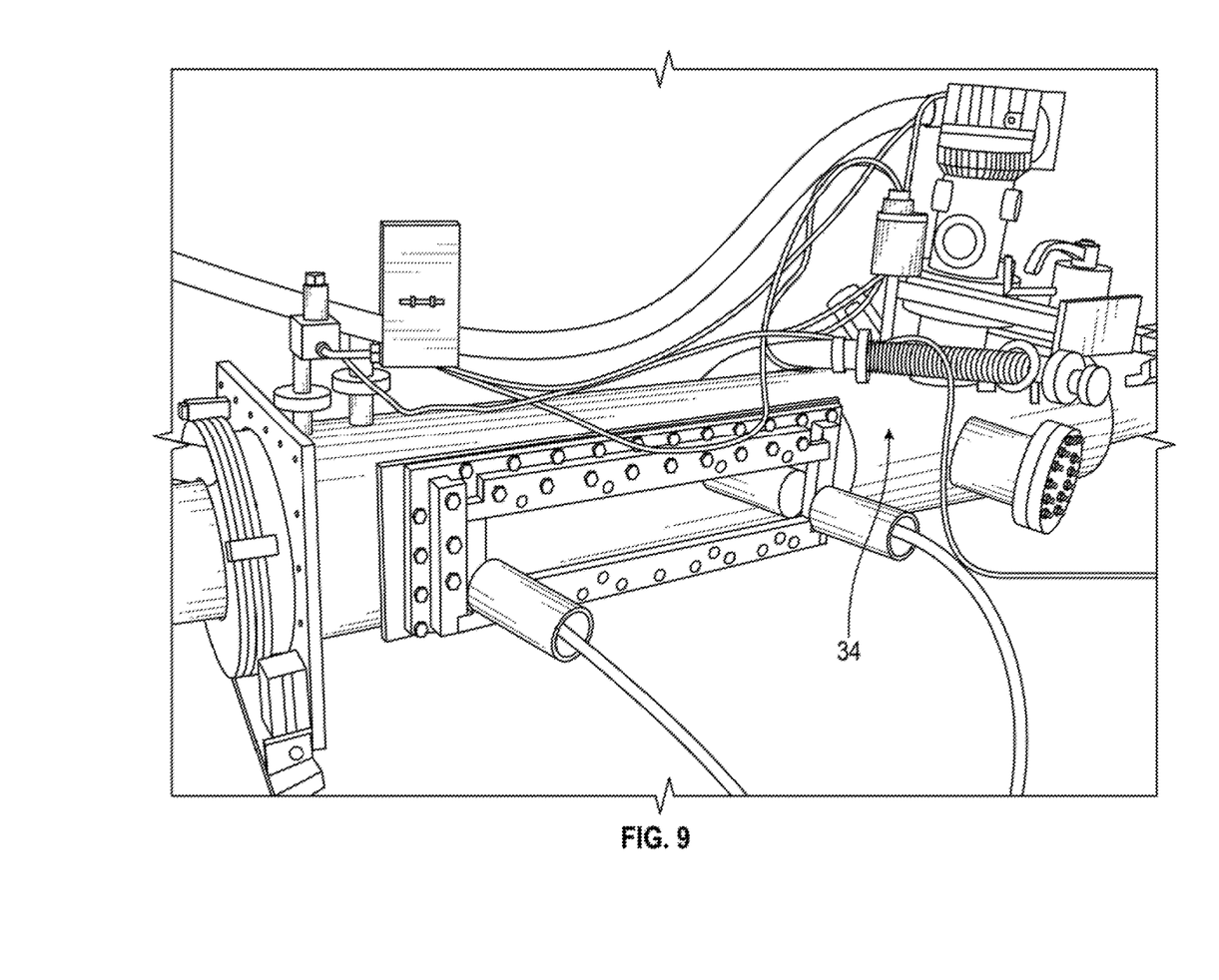
FIG. 9 is a depiction of an embodiment of a sputtering chamber for use with the apparatus.

As will be recognized by those of skill in the art, the speed of translation of the mandrel through the sputtering chamber 62, together with the power level on the chrome and boron carbide cathodes determines the coating thicknesses of these two films on the foil 34. The uniformity of the critical coating thickness of the $B_4C$ is preferably controlled to better than 0.1% by precise regulation of the cathode power level using an Advanced Energy regulating DC supply and the mandrel drive speed is preferably controlled to much better than 0.1% with a precision DC motor whose speed is monitored and controlled, preferably by a live time LabView program running on a powerful PC with backup power system. For any given foil width, the rotational speed of the mandrel is set as a precise ratio to the translation speed in order that the foil covers the mandrel with minimal gap and does not overlap. The LabView system can perform this task by controlling the rotational motor to turn at the precise fraction of the speed of the translation motor. In both cases the actual speed of rotation as detected by a motor transducer is controlled.

Figure 11:
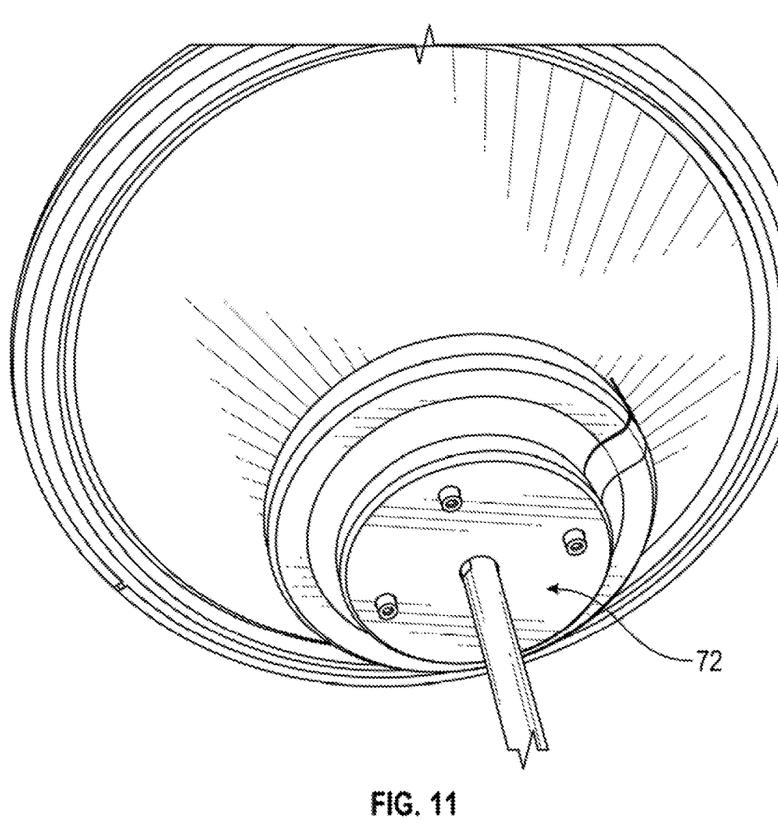
FIG. 11 is a depiction of an embodiment of the coated foil uptake reel for use in the apparatus.

Once the foil 34 has been coated, the next step 80 is to unwind the coated foil from the mandrel 12. A coated foil uptake reel 72 is provided for this function (step 70). As shown in FIG. 11, the take up reel 72 is of similar design and construction as the input reel 32. Preferably, the foil 34 is removed from the mandrel 12 prior to exiting the sputtering chamber 62. An exit reel chamber 68 connected to the sputter chamber vacuum in this case, of similar construction to the entry reel chamber 28, is preferably utilized receive coated foil. The reel 72, in this case, draws foil from the mandrel 12 as a result of torque applied with a torque motor. Preferably, torque is passed from torque motor into the vacuum through a rotary ferrofluidic seal. The bare mandrel 12 then passes out of the vacuum through similar set of transition seals as used on the input.

After the foil has been removed from mandrel 12, the first mandrel 12 continues to advance through the system until coupling 16 is exposed, at this step 90, the first mandrel 12 can be disconnected from the system. Preferably, mandrel 12 is then cleaned and reconnected to coupling 16 of the second mandrel 12 which is advancing through the process. In this manner, the process can continue indefinitely without interruption.

As will now be recognized by one of skill in the art, the process and apparatus of the present invention have significant economic advantages over the prior art systems. The embodiment of the invention, as was reduced to practice, produced significantly reduced cost of manufacturing boron-coated straw detectors by eliminating significant set up and down time costs through the continuous operation of the process. This embodiment produced enough coated foil to produce as much as 439 meters of straw per day, thereby reducing the cost of the coating process from about $58 per meter of straw to roughly $10 per meter of straw. As demonstrated in the table below, this equates to significant cost savings for detector products that utilize boron-coated straws.

| | | | Cost Benefit | | | |
|---|---|---|---|---|---|---|
| Detector name | Detector description | Number of straws | Coated area required ($m^2$) | Time to coat w/2 cathodes (hrs) | In-house Coating | Contract coating |
| BRD | Backpack, equivelant to 2 3He-tubes | 8 × 31 | 1.14 | 4.15 | $1,244 | $4,275 |

-continued

Cost Benefit

| Detector name | Detector description | Number of straws | Coated area required (m²) | Time to coat w/2 cathodes (hrs) | In-house Coating | Contract coating |
|---|---|---|---|---|---|---|
| NDM-95 | Portal, equivalent to 1 3He-tube | 95 | 2.64 | 9.60 | $2,880 | $9,900 |
| NDM-171 | Portal, equivalent to 2 3He-tubes | 171 | 4.76 | 17.3 | $5,193 | $17,850 |
| VMDS | Ultra-light sensitivity vehicle mounted system | 300 | 8.6 | 31.3 | $9,382 | $32,250 |
| HLNCC-II | Multiplicitity/ | 650 | 5.25 | 19.1 | $5,727 | $19,688 |
| AWCC | Coincidence counters | 1450 | 11.7 | 42.5 | $12764 | $43,875 |
| Imager | Imaging panel for neutron science (1 sq. meter, 5 layers) | 1470 | 34.6 | 1.26 | $37,745 | $129,750 |

Although the invention has been described in reference to its preferred embodiments, those of skill in the art may appreciate from this description various changes and modifications which can be made thereto which do not depart from the spirit and scope of the invention as described and claimed herein.

The invention claimed is:

1. An apparatus for applying a coating to a thin foil by a continuous, in-line process, the apparatus comprising:
    a first elongated, cylindrical mandrel, said first elongated, cylindrical mandrel being movable in a longitudinal direction;
    a foil input reel containing a roll of thin foil, said foil input reel supplying thin foil for winding onto said first elongated, cylindrical mandrel;
    a drive system for advancing said first elongated, cylindrical mandrel longitudinally via translation movement and for rotary translation of said first elongated, cylindrical mandrel, wherein the translation movement comprises longitudinally moving in a linear direction said first elongated, cylindrical mandrel sequentially through a first transition chamber, an etching chamber, a sputtering chamber, and a second transition chamber;
    the etching chamber for glow discharge cleaning and conditioning a surface of the thin foil as said first elongated, cylindrical mandrel moves longitudinally through said etching chamber;
    the sputtering chamber having a target comprising boron carbide for sputtering a thin layer comprising boron onto the surface of the thin foil as said first elongated, cylindrical mandrel moves longitudinally through said sputtering chamber; and
    a coated foil uptake reel for removing the thin foil from said first elongated, cylindrical mandrel after the thin layer comprising boron has been applied.

2. The apparatus of claim 1, wherein the thin foil comprises a copper foil.

3. The apparatus of claim 1, wherein the thin foil comprises an aluminum foil.

4. The apparatus of claim 1, wherein thin foil has a width of between about 0.25 and about three inches.

5. The apparatus of claim 1, further comprising a second elongated, cylindrical mandrel, said second elongated, cylindrical mandrel having a vacuum sealable coupling for disconnectably coupling said second elongated, cylindrical mandrel to said first elongated, cylindrical mandrel.

6. The apparatus of claim 5, wherein each mandrel has a coupling on one end and another coupling on the opposite end allowing the first elongated, cylindrical mandrel and the second elongated, cylindrical mandrel to be connected together from either end.

7. The apparatus of claim 5, wherein each mandrel has a male screw connection on one end and a female screw connection on the opposite end allowing the first elongated, cylindrical mandrel and the second elongated, cylindrical mandrel to be connected together from either end.

8. The apparatus of claim 1, wherein said first elongated, cylindrical mandrel comprises aluminum pipe.

9. The apparatus of claim 1, wherein said first elongated, cylindrical mandrel comprise nominal 4 inch OD pipe.

10. The apparatus of claim 1, wherein said first elongated, cylindrical mandrel comprises a wall thickness of about 0.25".

11. The apparatus of claim 1, wherein said first elongated, cylindrical mandrel is about 24 feet in length.

12. The apparatus of claim 1, wherein said drive system comprises a winch operably connected to said first elongated, cylindrical mandrel for translational movement.

13. The apparatus of claim 1, wherein said drive system comprises a high tension belt drive for rotational movement.

14. The apparatus of claim 1, wherein said drive system comprises an electric motor operably coupled to said first elongated, cylindrical mandrel for rotational movement.

15. The apparatus of claim 1, further comprising a control system for controlling rotational speed of said mandrel as a function of the speed of translation of said mandrel.

16. The apparatus of claim 1, wherein said foil input reel comprises drag torque control.

17. The apparatus of claim 1, wherein said sputtering chamber is configured to sputter a thin adhesion layer onto the thin foil prior to sputtering of the thin layer comprising boron.

18. The apparatus of claim 17, wherein said sputtering chamber is configured to sputter a thin adhesion layer comprising a metallic transition layer.

19. The apparatus of claim 17, wherein said sputtering chamber is configured to sputter a thin adhesion layer comprising chrome.

20. The apparatus of claim 1, further comprising the first transition chamber, prior to said etching chamber, through which said first elongated, cylindrical mandrel moves longitudinally, said first transition chamber for transitioning from atmospheric to vacuum pressure.

21. The apparatus of claim 20, wherein said first transition chamber comprises a secondary transition chamber for receiving and containing inert flowing gas maintained at a positive pressure relative to atmospheric pressure.

22. The apparatus of claim 21, wherein the inert gas is argon.

23. The apparatus of claim 20, wherein said first transition chamber comprises a plurality of energized seals.

24. The apparatus of claim 1, further comprising the second transition chamber, after said sputtering chamber, through which said first elongated, cylindrical mandrel moves longitudinally, said second transition chamber for transitioning from vacuum to atmospheric pressure.

25. The apparatus of claim 24, wherein said second transition chamber is of the same design as the first transition chamber.

26. The apparatus of claim 1, wherein said foil input reel is connected to said etching chamber allowing the thin foil to pass through an open flexible vacuum bellows into the etch chamber.

27. The apparatus of claim 1, wherein said foil input reel comprises pulleys for guiding the thin foil into and out of said etching chamber.

28. The apparatus of claim 1, wherein said coated foil uptake reel is connected to said sputtering chamber allowing the thin foil to pass through an open flexible vacuum bellows into the sputtering chamber.

29. The apparatus of claim 1, wherein said coated foil uptake reel comprises pulleys for guiding the thin foil out of said sputtering chamber.

30. The apparatus of claim 1, further comprising a flow restrictive chamber between said etching chamber and said sputtering chamber allowing said etching chamber and said sputtering chamber to operate at different pressures.

31. The apparatus of claim 1, wherein said sputtering chamber sputters a boron layer between about 0.1 and 3 microns thick.

32. The apparatus of claim 1, wherein said sputtering chamber further comprises a target comprising boron.

33. The apparatus of claim 1, wherein said thin layer comprising boron comprises 99% or greater pure boron carbide.

* * * * *